United States Patent
Gelhausen et al.

(10) Patent No.: US 8,588,275 B2
(45) Date of Patent: Nov. 19, 2013

(54) ELECTRONIC DEVICE AND METHOD FOR SPREAD SPECTRUM CLOCK (SSC) MODULATION

(75) Inventors: Frank Gelhausen, Isernhagen (DE); Oliver Piepenstock, Hannover (DE); Mustafa U. Erdogan, Allen, TX (US)

(73) Assignees: Texas Instruments Incorporated, Dallas, TX (US); Texas Instruments Deutschland GmbH, Freising (DE)

( * ) Notice: Subject to any disclaimer, the term of this patent is extended or adjusted under 35 U.S.C. 154(b) by 245 days.

(21) Appl. No.: 13/235,212

(22) Filed: Sep. 16, 2011

(65) Prior Publication Data

US 2012/0076176 A1 Mar. 29, 2012

(30) Foreign Application Priority Data

Sep. 29, 2010 (DE) .................. 10 2010 046 860

(51) Int. Cl.
*H04B 1/707* (2011.01)
*H03D 3/24* (2006.01)

(52) U.S. Cl.
USPC .......................................... 375/146; 375/376

(58) Field of Classification Search
USPC ................... 375/130, 146, 376; 327/147, 150
See application file for complete search history.

(56) References Cited

U.S. PATENT DOCUMENTS

| | | | |
|---|---|---|---|
| 5,774,511 A | 6/1998 | Boerstler | |
| 6,559,698 B1 * | 5/2003 | Miyabe | 327/157 |
| 6,590,888 B1 * | 7/2003 | Ohshima | 370/342 |
| 7,242,230 B2 | 7/2007 | Boyko et al. | |
| 2010/0027585 A1 * | 2/2010 | Jeanson et al. | 375/130 |
| 2011/0062994 A1 * | 3/2011 | Kusunoki | 327/48 |
| 2013/0021069 A1 * | 1/2013 | Tsangaropoulos et al. | 327/115 |

OTHER PUBLICATIONS

DE Search Report mailed Jul. 1, 2011.

* cited by examiner

*Primary Examiner* — Don N Vo
(74) *Attorney, Agent, or Firm* — Alan A. R. Cooper; W. James Brady, III; Frederick J. Telecky, Jr.

(57) ABSTRACT

The invention relates to an electronic device that includes a plurality of buffers and a phase locked loop. For each buffer a fractional divider is provided which is coupled to receive the output from the phase locked loop and configured to feed a divided output signal to a respective buffer. A spread spectrum clock control logic stage in the spread spectrum clock (SSC) is provided which is configured to individually adjust a value of the division of each fractional divider in order to individually and independently modulate the output signal of each fractional divider according to a spread spectrum modulation scheme.

5 Claims, 6 Drawing Sheets

| BINARY MULTIPLIER: | | 2^0 | 2^-1 | 2^-2 | 2^-3 | 2^-4 | 2^-5 | 2^-6 | 2^-7 | 2^-8 | 2^-9 | 2^-10 | 2^-11 |
|---|---|---|---|---|---|---|---|---|---|---|---|---|---|
| STEP NUMBER | SIGN | | | | | | | | | | | | |
| 0 | 0000 | +1 | 1 | 0 | 0 | 0 | 0 | 0 | 0 | 0 | 0 | 0 | 0 | 0 |
| 1 | 0001 | +1 | 1 | 0 | 0 | 0 | 0 | 0 | 0 | 0 | 0 | 0 | 0 | 1 |
| 2 | 0010 | +1 | 1 | 0 | 0 | 0 | 0 | 0 | 0 | 0 | 0 | 0 | 1 | 0 |
| 3 | 0011 | +1 | 1 | 0 | 0 | 0 | 0 | 0 | 0 | 0 | 0 | 1 | 1 | 0 |
| 4 | 0100 | +1 | 1 | 0 | 0 | 0 | 0 | 0 | 0 | 0 | 0 | 1 | 1 | 1 |
| 5 | 0101 | +1 | 1 | 0 | 0 | 0 | 0 | 0 | 0 | 0 | 1 | 1 | 0 | 0 |
| 6 | 0110 | +1 | 1 | 0 | 0 | 0 | 0 | 0 | 0 | 0 | 1 | 1 | 0 | 1 |
| 7 | 0111 | +1 | 1 | 0 | 0 | 0 | 0 | 0 | 0 | 0 | 1 | 0 | 1 | 0 |
| 8 | 1000 | +1 | 1 | 0 | 0 | 0 | 0 | 0 | 0 | 1 | 0 | 1 | 1 | 1 |
| 9 | 1001 | +1 | 1 | 0 | 0 | 0 | 0 | 0 | 0 | 0 | 1 | 1 | 0 | 0 |
| 10 | 1010 | +1 | 1 | 0 | 0 | 0 | 0 | 0 | 0 | 0 | 1 | 1 | 1 | 1 |
| 11 | 1011 | +1 | 1 | 0 | 0 | 0 | 0 | 0 | 0 | 0 | 1 | 1 | 0 | 0 |
| 12 | 1100 | +1 | 1 | 0 | 0 | 0 | 0 | 0 | 0 | 0 | 0 | 0 | 1 | 1 |
| 13 | 1101 | +1 | 1 | 0 | 0 | 0 | 0 | 0 | 0 | 0 | 0 | 0 | 1 | 0 |
| 14 | 1110 | +1 | 1 | 0 | 0 | 0 | 0 | 0 | 0 | 0 | 0 | 0 | 1 | 0 |
| 15 | 1111 | +1 | 1 | 0 | 0 | 0 | 0 | 0 | 0 | 0 | 0 | 0 | 0 | 1 |

| BINARY MULTIPLIER: | | | | | | | | | | | | | | |
|---|---|---|---|---|---|---|---|---|---|---|---|---|---|---|
| STEP NUMBER | | SIGN | 2^0 | 2^-1 | 2^-2 | 2^-3 | 2^-4 | 2^-5 | 2^-6 | 2^-7 | 2^-8 | 2^-9 | 2^-10 | 2^-11 |
| 0 | 0000 | +1 | 1 | 0 | 0 | 0 | 0 | 0 | 0 | 0 | 0 | 0 | 0 | 0 |
| 1 | 0001 | +1 | 1 | 0 | 0 | 0 | 0 | 0 | 0 | 0 | 0 | 1 | 0 | 0 |
| 2 | 0010 | +1 | 1 | 0 | 0 | 0 | 0 | 0 | 0 | 0 | 1 | 0 | 0 | 0 |
| 3 | 0011 | +1 | 1 | 0 | 0 | 0 | 0 | 0 | 0 | 0 | 1 | 1 | 0 | 0 |
| 4 | 0100 | +1 | 1 | 0 | 0 | 0 | 0 | 0 | 0 | 1 | 0 | 0 | 0 | 0 |
| 5 | 0101 | +1 | 1 | 0 | 0 | 0 | 0 | 0 | 0 | 1 | 0 | 1 | 0 | 0 |
| 6 | 0110 | +1 | 1 | 0 | 0 | 0 | 0 | 0 | 0 | 1 | 1 | 0 | 0 | 0 |
| 7 | 0111 | +1 | 1 | 0 | 0 | 0 | 0 | 0 | 0 | 1 | 1 | 1 | 0 | 0 |
| 8 | 1000 | +1 | 1 | 0 | 0 | 0 | 0 | 0 | 1 | 0 | 0 | 0 | 0 | 0 |
| 9 | 1001 | +1 | 1 | 0 | 0 | 0 | 0 | 0 | 1 | 0 | 0 | 1 | 0 | 0 |
| 10 | 1010 | +1 | 1 | 0 | 0 | 0 | 0 | 0 | 1 | 0 | 1 | 0 | 0 | 0 |
| 11 | 1011 | +1 | 1 | 0 | 0 | 0 | 0 | 0 | 1 | 0 | 1 | 1 | 0 | 0 |
| 12 | 1100 | +1 | 1 | 0 | 0 | 0 | 0 | 0 | 1 | 1 | 0 | 0 | 0 | 0 |
| 13 | 1101 | +1 | 1 | 0 | 0 | 0 | 0 | 0 | 1 | 1 | 0 | 1 | 0 | 0 |
| 14 | 1110 | +1 | 1 | 0 | 0 | 0 | 0 | 0 | 1 | 1 | 1 | 0 | 0 | 0 |
| 15 | 1111 | +1 | 1 | 0 | 0 | 0 | 0 | 0 | 1 | 1 | 1 | 1 | 0 | 0 |

| BINARY MULTIPLIER: | | $2^0$ | $2^{-1}$ | $2^{-2}$ | $2^{-3}$ | $2^{-4}$ | $2^{-5}$ | $2^{-6}$ | $2^{-7}$ | $2^{-8}$ | $2^{-9}$ | $2^{-10}$ | $2^{-11}$ |
|---|---|---|---|---|---|---|---|---|---|---|---|---|---|
| STEP NUMBER | SIGN | | | | | | | | | | | | |
| 0 | −1 | 1 | | | | | | | | | | | |
| 1 | −1 | 1 | 0 | 0 | 0 | 0 | 0 | 1 | 0 | 0 | 0 | 0 | 0 |
| 2 | −1 | 1 | 0 | 0 | 0 | 0 | 0 | 0 | 1 | 1 | 0 | 0 | 0 |
| 3 | −1 | 1 | 0 | 0 | 0 | 0 | 0 | 0 | 1 | 0 | 0 | 0 | 0 |
| 4 | +1 | 1 | 0 | 0 | 0 | 0 | 0 | 0 | 0 | 1 | 0 | 0 | 0 |
| 5 | +1 | 1 | 0 | 0 | 0 | 0 | 0 | 0 | 0 | 0 | 0 | 0 | 0 |
| 6 | +1 | 1 | 0 | 0 | 0 | 0 | 0 | 0 | 1 | 0 | 0 | 0 | 0 |
| 7 | +1 | 1 | 0 | 0 | 0 | 0 | 0 | 0 | 1 | 1 | 0 | 0 | 0 |
| 8 | +1 | 1 | 0 | 0 | 0 | 0 | 0 | 0 | 0 | 1 | 0 | 0 | 0 |
| 9 | +1 | 1 | 0 | 0 | 0 | 0 | 0 | 0 | 1 | 0 | 0 | 0 | 0 |
| 10 | +1 | 1 | 0 | 0 | 0 | 0 | 0 | 0 | 1 | 1 | 0 | 0 | 0 |
| 11 | +1 | 1 | 0 | 0 | 0 | 0 | 0 | 0 | 0 | 1 | 0 | 0 | 0 |
| 12 | +1 | 1 | 0 | 0 | 0 | 0 | 0 | 0 | 0 | 0 | 0 | 0 | 0 |
| 13 | −1 | 1 | 0 | 0 | 0 | 0 | 0 | 0 | 0 | 1 | 0 | 0 | 0 |
| 14 | −1 | 1 | 0 | 0 | 0 | 0 | 0 | 0 | 1 | 0 | 0 | 0 | 0 |
| 15 | −1 | 1 | 0 | 0 | 0 | 0 | 0 | 0 | 1 | 1 | 0 | 0 | 0 |

| | | 0000 | | | | | | | | | | | |

Binary Multiplier codes (Step → Binary): 0:0000, 1:0001, 2:0010, 3:0011, 4:0100, 5:0101, 6:0110, 7:0111, 8:1000, 9:1001, 10:1010, 11:1011, 12:1100, 13:1101, 14:1110, 15:1111

FIG. 8

ELECTRONIC DEVICE AND METHOD FOR SPREAD SPECTRUM CLOCK (SSC) MODULATION

CROSS-REFERENCE TO RELATED APPLICATIONS

This application is claims priority from German Patent Application No. 10 2010 046 860.6, filed Sep. 29, 2010, which is hereby incorporated by reference for all purposes.

TECHNICAL FIELD

The invention relates to an electronic device and a method for providing a spread spectrum clock modulated signal.

BACKGROUND

For many electronic systems, it is necessary to control the electromagnetic emissions in order to fulfill electromagnetic interference (EMI) standards. Conventional systems and methods typically use EMI-filter ferrite beads or apply specific shielding techniques on printed circuit boards.

It is further known that electromagnetic interference can be reduced, if clock signals are modulated according to a spread spectrum pattern. The clock spectrum is then spread which reduces the maximum peak power of the clock signal in a specific frequency band around the nominal clock frequency. This well known principle is also referred to as spread-spectrum-clocking (SSC). SSC makes it possible to meet EMI standard requirements with a reduced number and complexity of EMI filter components. This reduces the costs of the electronic systems.

FIG. 1 shows a simplified clock diagram of a prior art configuration for producing spread spectrum modulated clock signals. There is a clock generator TCXO producing a stable clock signal FX which might be divided by a factor R. The divided clock signal FR is then passed to a phase locked loop (PLL). The phase locked loop includes a phase detector, a loop filter, a buffer and a voltage controlled oscillator VCO, as well as a phase interpolator and a further divider. The output signal FVCO of the VCO is phase interpolated, divided by factor N and fed to the phase detector. There is further a spread spectrum modulation stage SSC-MOD which interacts with the divider and the phase interpolator in order to modulate the signal that is fed back to the phase detector. Accordingly, the whole phase locked loop is controlled so as to produce a spread spectrum modulated output signal FVCO. Some systems require multiple spread spectrum clock modulated signals which are to be modulated by individual different schemes. With the approach shown in FIG. 1, this would require numerous phase locked loops and SSC modulation stages in order to provide the required modulated signals. Chip area, power consumption and complexity of the circuits however would increase substantially, if the circuit of FIG. 1 was integrated multiple times on the same integrated circuit.

SUMMARY

It is an object of the invention to provide an electronic device configured to produce multiple SSC modulated clock signals having lower power consumption and requiring less chip area than prior art solutions.

According to an aspect of the invention, an electronic device is provided which comprises a plurality of buffers and a phase locked loop. For each buffer, a fractional divider is provided which is coupled to receive the output from the phase locked loop and configured to feed a divided output signal to a respective buffer. Furthermore, there is a spread spectrum control logic stage for each fractional divider that is configured to individually vary (adjust) the value of the division of the corresponding fractional divider over time in order to individually and independently modulate the output signal of each fractional divider according to an individual spread spectrum modulation scheme. According to this aspect of the invention, the clock signal produced by the phase locked loop is not modulated but fed to multiple fractional dividers. Each of the dividers can individually be adjusted such that its input clock signal is divided by varying factors such that it output clock signal behaves according to an individual SSC modulation scheme. Accordingly, the frequency or phase of the output signal of the divider is changed according to the variation of the value of the division. In a preferred embodiment the value of the division of the divider is changed by using varying divisors. The different divisors may then be fed to the divider. The value of the division or the divisor is then a function of time. The variation of the value of the division or the divisor is performed with a specific modulation frequency. The modulation frequency may be derived from the frequency of the PLL. There may be several SSC control stages for changing/adjusting the value of the divisions (for example by determining and providing the different divisor values for the dividers) over time. The solution according to this aspect of the invention not only reduces power consumption and chip area compared with straightforward prior art solutions providing a separate PLL for each SSC modulated signal, but it also eliminates problems occurring from noise and interference between multiple phase locked loops on the same integrated circuit.

According to an aspect of the invention, a triangular SSC modulation scheme may be used. The SSC control logic stage may then be configured to provide one or more triangular SSC modulation schemes to the corresponding fractional divider. The triangular SSC modulation shape may advantageously be approximated by a specific number of discrete steps.

In an embodiment, the number of steps may be eight. This means that the triangular SSC modulation shape may be approximated by eight discrete steps up and eight discrete steps down. However, different numbers of steps may be used in other embodiments. Using a discrete number of steps further simplifies the required control logic and reduces complexity, power consumption and chip area.

In an embodiment, the triangular modulation scheme may use modulation depths of either −0.5%, −2% or ±2% of the nominal output frequency. These values comply with several standards.

The present invention also provides a method of producing multiple SSC modulated clock signals. A clock signal may then be provided by a phase locked loop. The clock signal from the phase locked loop may be divided by multiple different values of the division. The values of the division may be varied in accordance with a modulation scheme that serves to spread the spectrum of the divided clock signal. Multiple SSC modulated clock signals may then be produced, each of which is individually modulated according to one out of several different predetermined SSC modulation schemes. The values of the division for the modulation schemes may be stored in the electronic device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF DRAWINGS

For a more complete understanding of the present invention, and the advantages thereof, reference is now made to the following descriptions taken in conjunction with the accompanying drawings, in which:

FIG. 6 shows a table of an SSC modulation scheme according to an embodiment of the invention;

FIG. 7 shows another table of an SSC modulation scheme according to an embodiment of the invention; and FIG. 8 shows another table of an SSC modulation scheme according to an embodiment of the invention.

DETAILED DESCRIPTION OF EMBODIMENTS

Figure 1:
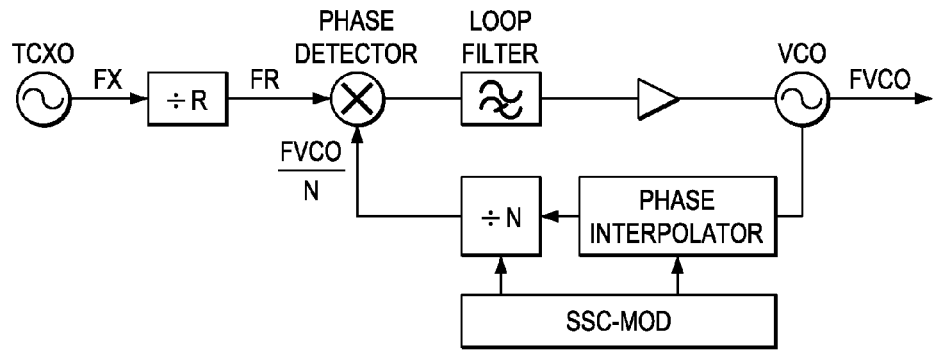
FIG. 1 shows a simplified clock diagram of an SSC modulator according to the prior art.

Refer now to the drawings wherein depicted elements are, for the sake of clarity, not necessarily shown to scale and wherein like or similar elements are designated by the same reference numeral through the several views.

Figure 2:
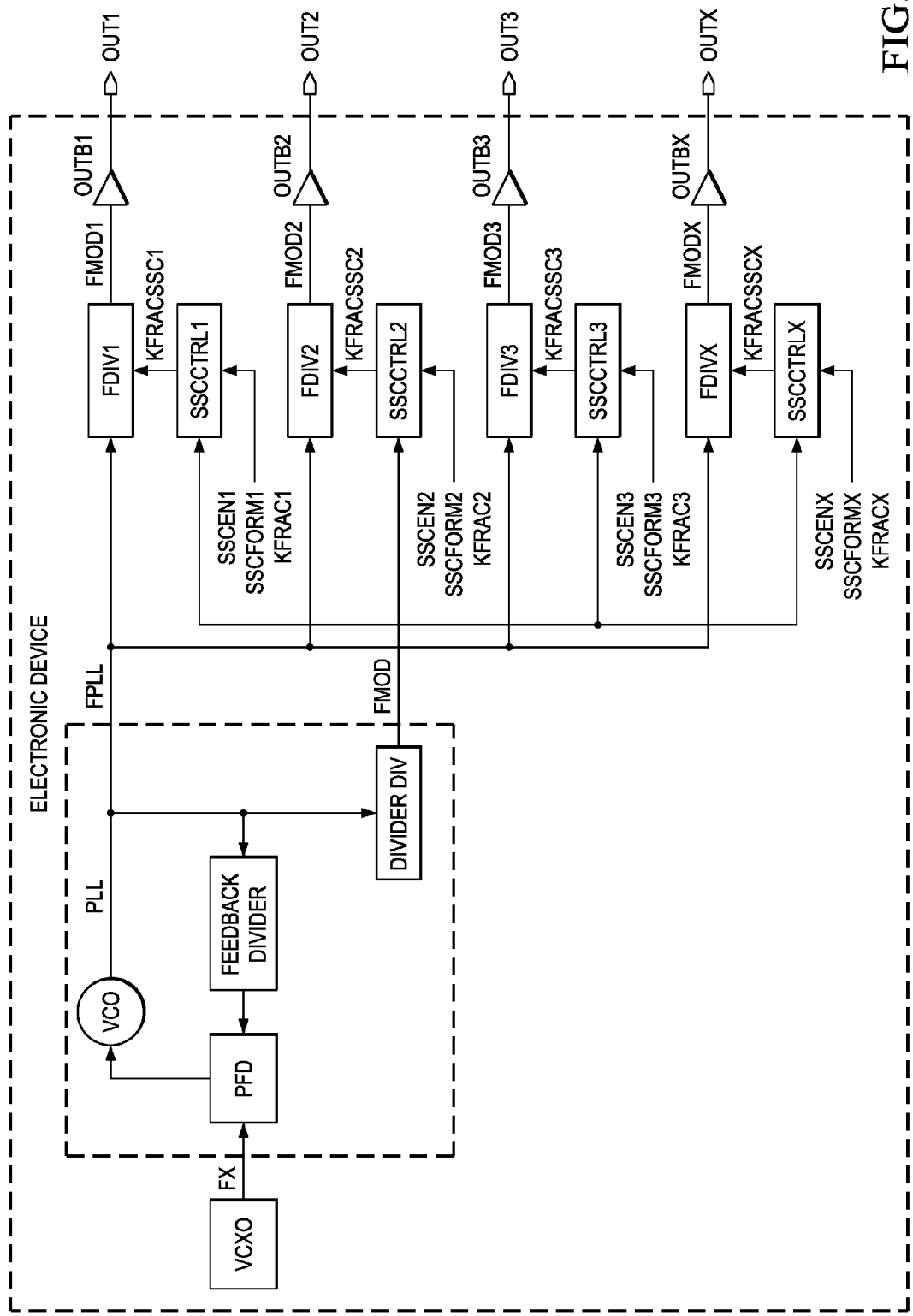
FIG. 2 shows an electronic device according to an embodiment of the invention.

FIG. 2 shows a simplified block diagram of an electronic device according to aspects of the invention. The electronic device 1 may be an integrated electronic circuit. The electronic device may be an integrated clock synthesizer for generating multiple individually SSC modulated clock signals. There is a phase locked loop PLL producing a clock signal FPLL. The clock signal FPLL is fed to multiple fractional dividers FDIV1, FDIV2, FDIV3, ..., FDIVX. The number of fractional dividers can vary according to the specific requirements of the target application. The fractional dividers FDIV1, FDIV2, FDIV3, ..., FDIVX feed respective modulated output signals FMOD1, FMOD2, FMOD3, ..., FMODX to corresponding output buffers OUTB1, OUTB2, OUTB3, ..., OUTBX. Each of the output buffers OUTB1, OUTB2, OUTB3 ..., OUTBX produces a corresponding buffered output signal OUT1, OUT2, OUT3 ..., OUTX.

The fractional dividers FDIV1, FDIV2, FDIV3 ..., FDIVX receive values of the division (or divide values or divisors) KFRACSSC1, KFRACSSC2, KFRACSSC3, ..., KFRACSSCX from the spread spectrum clock (SSC) control logic stages SSCCTRL1, SSCCTRL2, SSCCTRL3, ..., SSCCTRLX. Each of the fractional dividers FDIV1, FDIV2, FDIV3 ..., FDIVX has a corresponding SSC control logic stage SSCCTRL1, SSCCTRL2, SSCCTRL3, ..., SSCCTRLX for producing an individual divide value KFRACSSC1, KFRACSSC2, KFRACSSC3, ..., KFRACSSCX such that each output FMOD1, FMOD2, FMOD3, ..., FMODX can individually be SSC modulated. The phase locked loop PLL receives a stable clock signal FX from, for example, a crystal oscillator VCXO. The output clock signal FPLL of the phase locked loop may then be a stable and constant clock signal of a fixed frequency. This stable clock signal FPLL is divided by the multiple dividers FDIV1, FDIV2, FDIV3, ..., FDIVX according to individual modulation schemes which are applied through the divisor values KFRACSSC1, KFRACSSC2, KFRACSSC3, ..., KFRACSSC. Consequently, each divider output signal FMOD1, FMOD2, ..., FMODX is modulated according to an individual SSC modulation scheme. The modulation scheme for FDIV1 may then be different from the modulation scheme FDIV2 and FDIV3 which in turn can have a different modulation scheme from FDIVX.

The SSC control logic stages SSCCTRL1, SSCCTRL2, SSCCTRL3, ..., SSCCTRLX are configured to receive a respective enable signal SSCEN[1 ... X], a respective format signal SSCFORM[1 ... X] and a basic fractional divider value KFRAC[1 ... X]. The SSC control logic stages SSCCTRL1, SSCCTRL2, SSCCTRL3, ..., SSCCTRLX modulate the fractional dividers FDIV1, FDIV2, FDIV3 ..., FDIVX divisor values KFRACSSC1, KFRACSSC2, KFRACSSC3, ..., KFRACSSCX periodically over time by generating the modulated divisor values KFRACSSC1, KFRACSSC2, KFRACSSC3, ..., KFRACSSCX in order to comply with the required SSC modulation scheme for the respective channel (or output OUT1 to OUTX). Therefore, the SSC control logic stages SSCCTRL1, SSCCTRL2, SSCCTRL3, ..., SSCCTRLX receive a modulation clock FMOD as an input signal, which determines the time-base of the SSC modulation frequency. The modulation clock is derived from the PLL output signal FPLL. The clock FPLL output by the PLL is passed through a divider DIV. The divided clock signal FPLL is then FMOD which is used by the SSC control logic stages SSCCTRL1, SSCCTRL2, SSCCTRL3, ..., SSCCTRLX as the modulation clock frequency. The shown SSC architecture uses only a single PLL instead of multiple PLLs for each output signal OUT1, ..., OUTX. The frequency of the clock signals FMOD1, ..., FMODX of the fractional dividers FDIV1, ..., FDIVX are then given by the input clock frequency of the clock signal FPLL divided by the divisor value KFRACSSC1, KFRACSSC2, KFRACSSC3 ..., KFRACSSCX of the fractional divider:

$$FMODi = \frac{FPLL}{KFRACSSCi}$$

wherein FPLL is the clock frequency of the output signal of the PLL, FMODi is one of the fractional dividers FDIV1, FDIV2, FDIV3 ..., FDIVX and KFRACSSCi is the corresponding value of the division or divisor KFRACSSC1, KFRACSSC2, KFRACSSC3 ..., KFRACSSCX of the fractional divider. The index i is 1, 2, 3, ..., X. The divisor values KFRACSSCi are a function of time KFRACSSCi(t).

In an embodiment, FPLL may be 250 MHz, FMOD may be 100 MHz, the format may be −0.5% and KFRACSSCi(t) may be modulated between 2.5 and 2.5125. The modulated divider output clock signals FMODi of the dividers FDIVi are then also functions of the time (FMODi(t)).

Figure 3:
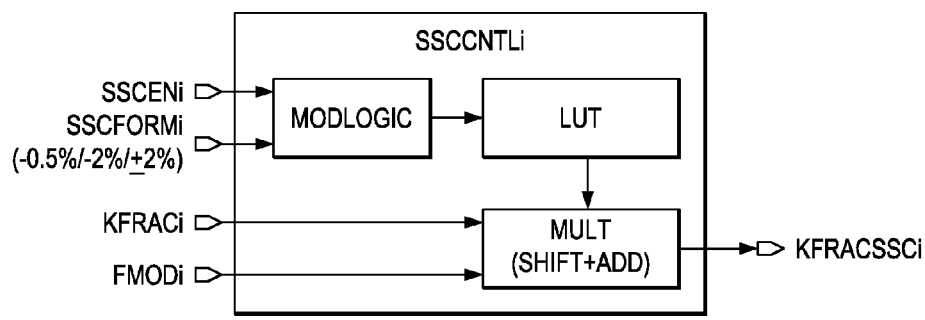
FIG. 3 shows a block diagram of an SSC control logic stage according to an embodiment of the invention.
Figure 5:
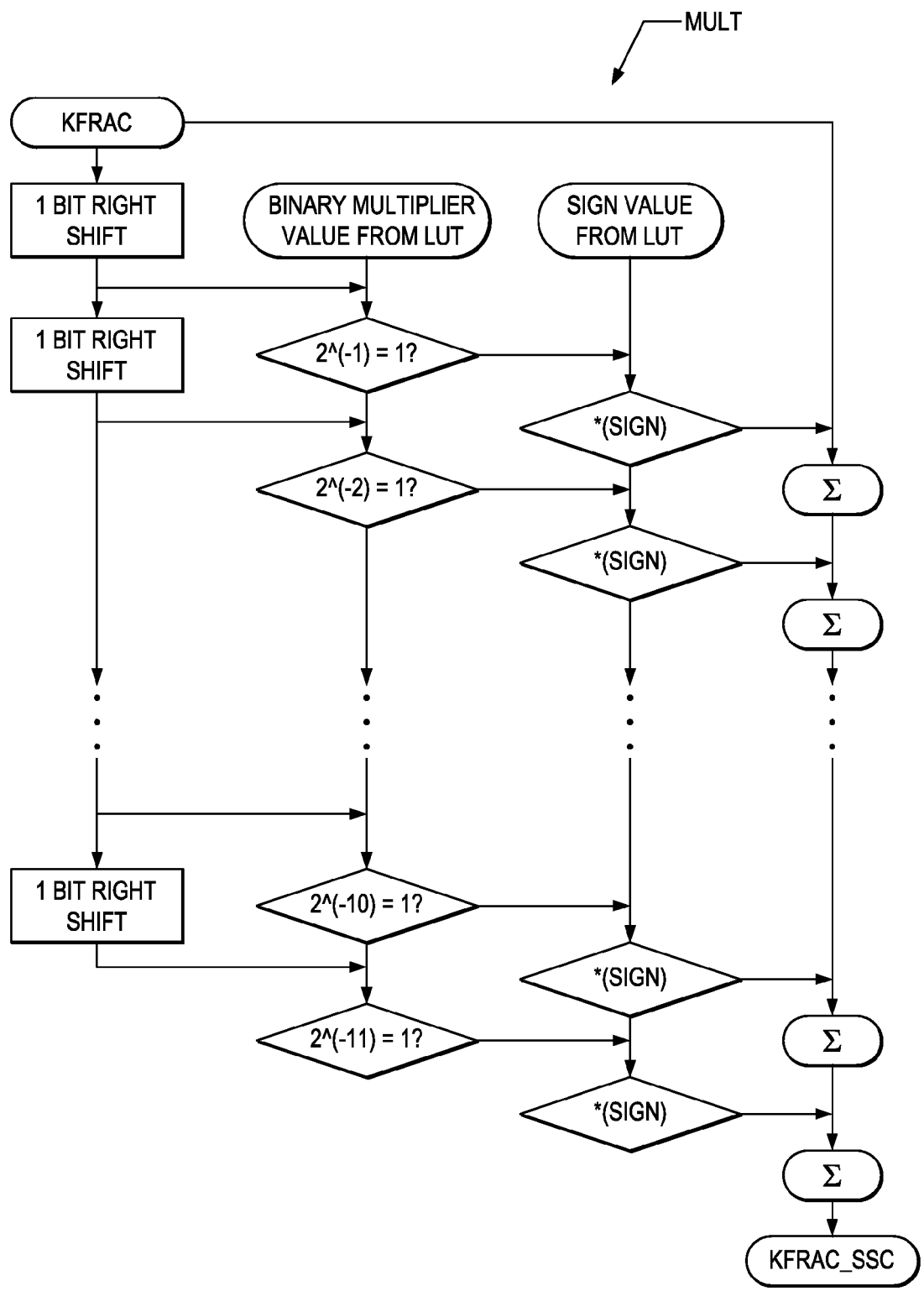
FIG. 5 shows a flow chart illustrating a scheme of adapting the value of the division according to an embodiment of the invention.

FIG. 3 shows a simplified block diagram of one of the SSC control logic stages SSCCTRL1, SSCCTRL2, SSCCTRL3, ..., SSCCTRLX which is referred to as SSC-CTRLi (with i=1 to X). There is a digital multiplier. In this embodiment, the multiplier MULT can be implemented in a very simple manner as a shift register and an adder. FIG. 5 illustrates an example implementation for the multiplier MULT which will be explained in detail with respect to FIG. 5. There is also a look up table LUT and a modulation logic MODLOGIC. The SSC control logic stage SSCCNTLi is enabled with an enable signal SSCENi. The modulation logic MODLOGIC receives the format signal SSCFORMi that indicates various modulation formats as for example −0.5, −2% or ±2%. In the SSC control stage SSCCTRLi, a multiplying scheme is implemented that multiplies the initial or basic divisor value KFRAC with the correct multiplier value for each discrete modulation step. The fractional divisor value KFRACSSCi(t) is then periodically modulated over time. The digital multiplier values required to determine how the divisor value KFRACSSCi(t) is to be calculated in each discrete modulation step are stored in one or more look up tables LUT. The values stored in the LUT may be hardcoded by means of a read only memory, or softcoded into a random access memory which is loaded with the right values when initializing the device. The look up table LUT also stores the sign for each multiplier value in order to allow up- and downspread SSC modulation. The logic MODLOGIC selects the correct look up table LUT for the required SSC modulation shape and enables the SSC modulation in response to the enabling signal SSCENi. The modulation clock signal FMOD clocks the digital multiplier MULT such that the digital value of the fractional divisor value KFRAC is multiplied with the respective values stored in and retrieved from the look up table LUT. An SSC modulated digital divisor value KFRACSSCi(t) is then produced at the multiplier MULT output. The values KFRACSSCi(t) is then fed to the fractional dividers FDIVi. Examples for the look up table are shown in FIG. 6, FIG. 7 and FIG. 8.

Figure 4:
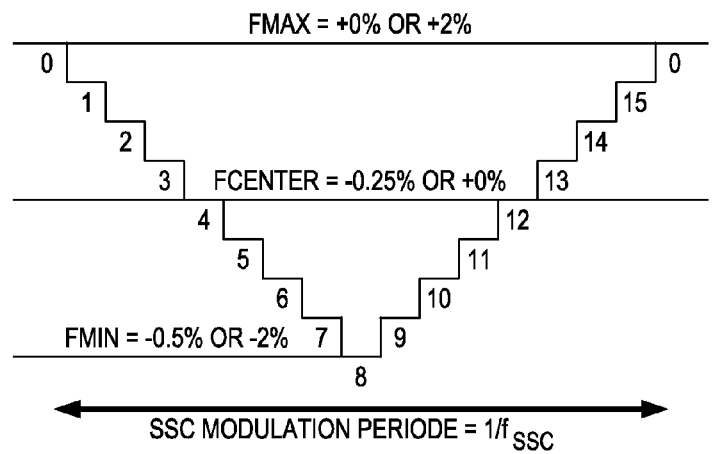
FIG. 4 shows a diagram illustrating an SSC modulation scheme according to an embodiment of the invention.

FIG. 4 shows a diagram illustrating a discrete approximation of an SSC modulation shape according to embodiments of the invention. The shown example relates to a triangular modulation scheme with modulation depths of −0.5%, −2% or ±2% of the nominal output frequency. The negative values are referred to as downspread as the nominal frequency is only reduced. The +/−2% is referred to as centerspread as the frequency is varied by 2% around the center frequency. In the shown example, the triangular SSC modulation shape is approximated by eight discrete steps up and eight discrete steps down. The steps correspond to divisor values KFRACSSCi. However, other embodiments may use a different number of steps and respective divisor values KFRACSSCi. The divisor values KFRACSSCi are then varied in accordance with the shown scheme. This means that divisor values KFRACSSCi are determined such that frequency of the output clock signals FMODi are changed between the maximum frequency FMAX and the minimum frequency FMIN. The frequency values FMAX, FCENTER and FMIN can correspond to FMAX=+0% or +2%, FCENTER=−0.25% or 0% and FMIN=−0.5% or −2% dependent on the chosen SSC format, they are select by signal SSCFORMi.

In an advantageous embodiment, the digital multiplier MULT shown in FIG. 4 can be implemented in a very efficient manner. The binary multiplication by the factor 2 is equivalent to a left shift of the binary word, while a multiplication by ½ is equivalent a right shift of the binary word. The multiplication of KFRAC by 1,00000000001 in binary format equals the sum of KFRAC plus KFRAC shifted by 11 bits to the right. This principle is further illustrated in FIG. 5. FIG. 5 shows a flow chart illustrating the way of calculating the different divisor values KFRACSSCi(t) in an advantageous embodiment. Accordingly, the basic or initial divide value KFRAC is fed to a summing element Σ and to a series of right shifters, for shifting KFRAC by one bit in each shifter. The control logic stages SSCCRTLi, and more specifically, the values in the look-up-table LUT determine how the divisor value KFRAC is shifted and how the divided fractions of KFRAC are added in accordance with the requested divisor value KFRACSSCi(t). In order to provide up- and downspread, the shifted fractions of KFRAC may be added or subtracted according to the sign values also stored in and retrieved from the LUT. This SSC modulation scheme provides the necessary KFRACSSCi(t) values. The values from the look up table can have the form shown in FIG. 6 to FIG. 8.

FIG. 6, FIG. 7 and FIG. 8 show different tables relating to modulation schemes stored as look up tables LUTs. Each of the shown tables implements a triangular SSC modulation shape. However, the present invention is not limited to triangular modulation shapes. FIG. 6 is a triangular SSC modulation shape with −0.390625% down spread. The zeros and ones indicate whether or not a shifted value is used. The sign values indicated if the shifted fraction is added or subtracted. FIG. 7 is a look up table for a triangular SSC modulation shape with −1.5625% downspread and FIG. 8 is a look up table for a triangular SSC modulation shape with ±1.5625 center spread.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

The invention claimed is:

1. An electronic device comprising a plurality of buffers and a phase locked loop, wherein for each buffer a fractional divider is provided which is coupled to receive the output from the phase locked loop and configured to feed a divided output signal to a respective buffer, and wherein a spread spectrum clock (SSC) control logic stage is provided for each fractional divider which is configured to individually vary the value of the division of each fractional divider over time in order to individually and independently modulate the output signal of each fractional divider according to a spread spectrum modulation scheme.

2. The electronic device according to claim 1, wherein the SSC control logic stage is configured to approximate a specified SSC modulation shape by discrete modulation steps.

3. The electronic device according to claim 1, wherein the SSC control logic stage is configured to perform the SSC modulation according to a triangular modulation scheme at modulation depths of either −0.5%, −2% or ±2% of the nominal output frequency.

4. The electronic device according to claim 2, wherein the triangular SSC modulation shape is approximated by eight discrete steps up and eight discrete steps down.

5. A method of generating multiple spread spectrum clock (SSC) modulated clock signals, the method comprising: providing a clock signal by a phase locked loop, dividing the clock signal from the phase locked loop by different values of the division in order to produce multiple divided clock signals, varying the values of the division in accordance with SSC modulation schemes that serve to spread the spectrum of the divided clock signals, using the divided clock signals as the multiple SSC modulated clock signals.

* * * * *